United States Patent [19]

Sheldon

[11] 3,735,483

[45] May 29, 1973

[54] SEMICONDUCTOR PASSIVATING PROCESS

[75] Assignee: Gary S. Sheldon, Union Springs, N.Y.

[73] Assignee: General Electric Company, Syracuse, N.Y.

[22] Filed: Aug. 25, 1971

[21] Appl. No.: 174,974

Related U.S. Application Data

[62] Division of Ser. No. 21,373, March 20, 1970, Pat. No. 3,642,597, which is a division of Ser. No. 782,093, Dec. 9, 1968, abandoned.

[52] U.S. Cl.........................................29/580, 29/588
[51] Int. Cl...............................................B01j 17/00
[58] Field of Search..........................29/580, 583, 588

[56] References Cited

UNITED STATES PATENTS

| | | | |
|---|---|---|---|
| 3,343,255 | 9/1967 | Donovan | 29/583 |
| 3,383,760 | 5/1968 | Shwartzman | 29/583 |
| 3,535,774 | 10/1970 | Baker | 29/580 |

*Primary Examiner*—Charles W. Lanham
*Assistant Examiner*—W. Tupman
*Attorney*—Robert J. Mooney, Nathan J. Cornfeld, Carl O. Thomas et al.

[57] ABSTRACT

A semiconductive wafer is selectively protected and etched so that a grid of intersecting grooves is formed on one or both major surfaces. The grooves extend below junction depth. Oxide lip portions overhanging the grooves may be removed and the grooves may be treated to enhance wettability. A passivant is then selectively electrophoretically deposited into the grooves. Where glass is employed as the passivant it is fired after deposition. The wafer may be sub-divided into pellets before or after contacts are applied. A pliant supplemental passivant encapsulates the semiconductive pellet, and a casement is molded thereabout to complete the device. One semiconductive element that may be obtained by the passivation process is characterized by a passivant coating on a beveled periphery that progressively increases the thickness as it approaches a major surface intersecting the beveled periphery.

1 Claim, 8 Drawing Figures

SEMICONDUCTOR PASSIVATING PROCESS

Figure 1:
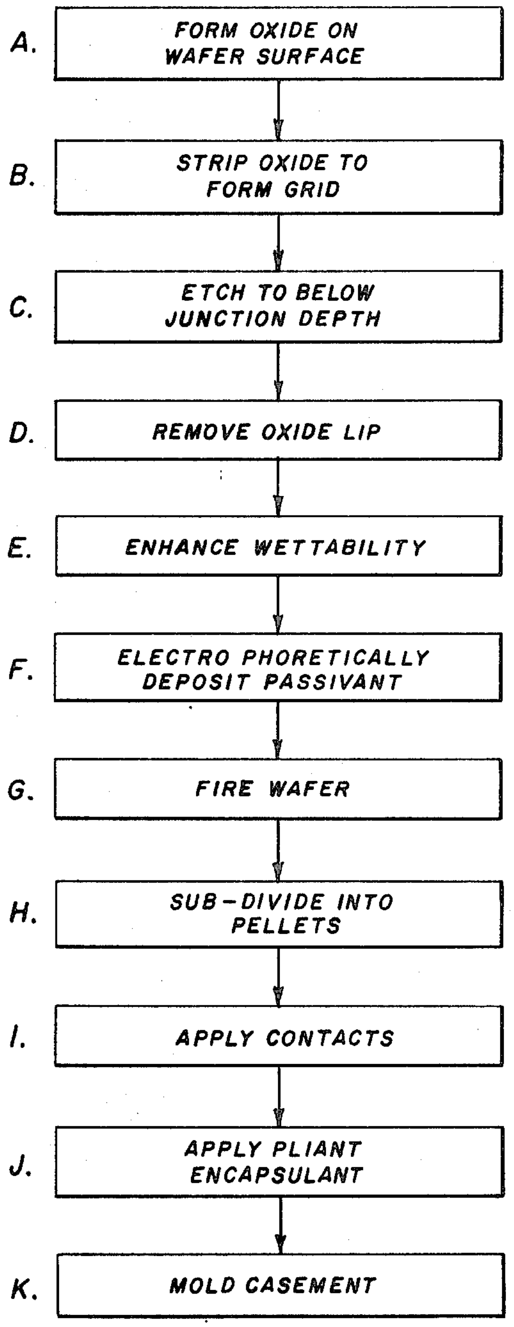

My invention is directed to a process for passivating a junction containing semiconductive element by the selective electrophoretic deposition of a glass thereon and this application is a division of application Ser. No. 21,373 filed Mar. 20, 1970, and now Pat. No. 3,642,597, which in turn is a division of my copending application Ser. No. 782,093, filed Dec. 9, 1968 and now abandoned.

In the manufacture of electrical devices containing junction semiconductive elements, such as, for example, diodes, transistors, silicon controlled rectifiers, triacs, etc., it is recognized that the electrical properties of the semiconductive elements may be adversely altered by even minute quantities of contaminants. For example, semiconductive elements are protected against even the low contaminant levels found in the air. The elements are particularly sensitive at the peripheral intersection of their junction regions.

It has been conventional practice to mount semiconductive elements within hermetically sealed device housings. More recently molded casements substantially impervious to contaminants such as air and moisture have been employed. To best protect or passivate the junction regions of the semiconductive elements glass coatings have been deposited over the peripheral regions of the semiconductive elements at least adjacent the junction intersections.

It has been recognized often to be disadvantageous to attempt the glass passivation of semiconductive elements individually. One approach that has been advanced for the simultaneous glass passivation of a plurality of junction containing semiconductive elements is to form a junction containing semiconductive wafer and to use an electrically conductive adhesive to bond one face of the wafer to a metallic substrate. The wafer may then be sawed into a plurality of chips. Glass may be applied to the exposed peripheral junction intersections of the chips by electrophoretically depositing glass onto the substrate and chips.

The process offers the advantage of group handling and coating, but suffers a number of inherent procedural disadvantages. First, the use of an electrically conductive adhesive for bonding the wafer offers a possibility to contaminate the chips and requires a terminal cleaning step to remove the adhesive. While the wafer may be securely adhered to the conductive substrate, a number of the chips may fall from the substrate after sawing if the adhesive is not uniformly distributed. The necessity of sub-dividing the wafer only after it is bonded to the substrate, of course, limits the choice of sub-dividing techniques employable and effectively prevents double groove etching--that is, simultaneously etching grooves from opposite faces of the wafer----which has proven highly advantageous in obtaining beveled periphery elements capable of withstanding elevated blocking potentials. A very fundamental disadvantage of the glass deposition process is that the exposed portions of the metallic substrate compete with the chips in their attraction for the glass as it is electrophoretically deposited. This results in the glass being most thickly deposited on the substrate, rather than on the semiconductive chips. Also, in later separating the chips the glass layer is broken at its thickest point, thereby increasing the possibility for contaminant admitting fractures to be introduced into the glass overlying the junction.

It is an object of my invention to provide a process for protecting junction semiconductive elements from contamination which allows the simultaneous passivation of a plurality of elements, which is applicable to elements of diverse geometries, which allows simultaneous passivation of opposed faces of the elements, which allows passivant deposition selectively on the elements, and which reduces in number and complexity the process steps required to achieve a passivated junction semiconductive element.

This and other objects of my invention are accomplished in one aspect by providing a process for passivating junction containing semiconductive elements comprised of applying an electrically insulative coating to selected surface areas of a junction containing a semiconductive wafer to leave remaining surface areas exposed. The semiconductive wafer is etched through the exposed surface areas to form a depression extending to a depth below at least one junction. Preferably, but not necessarily, at least a portion of the insulative coating may be removed in etching and the depression may be treated to enhance its wettability by glass. A junction passivant is thereafter electrophoretically deposited within the etched depression of the semiconductive wafer.

Figure 3:
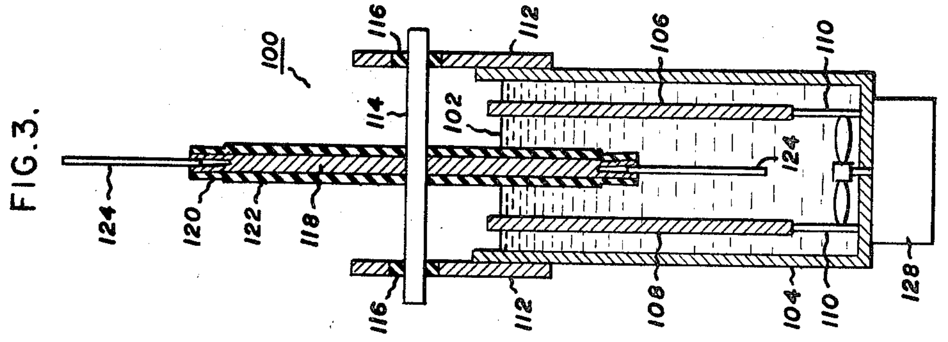
Figure 2:
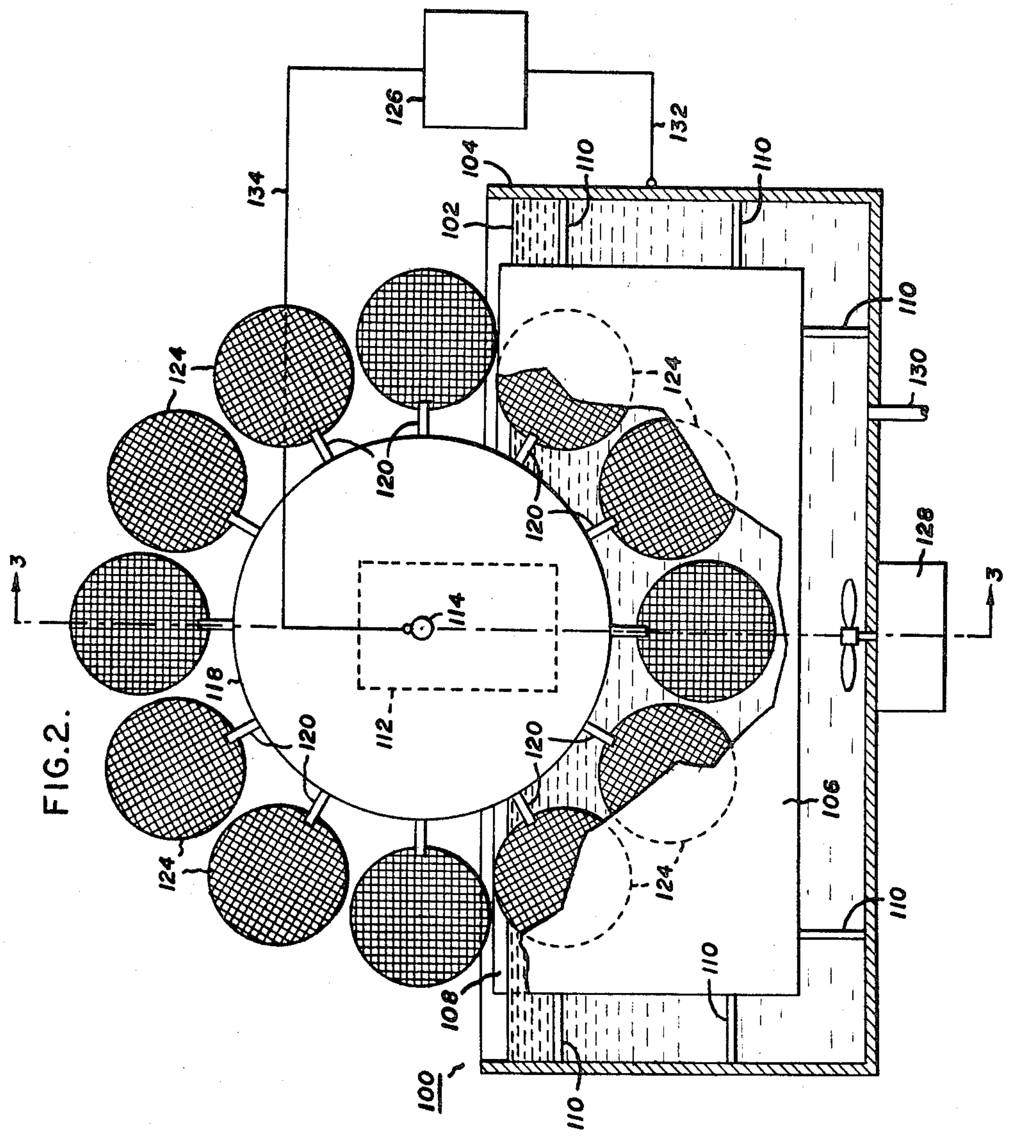
Figure 5:
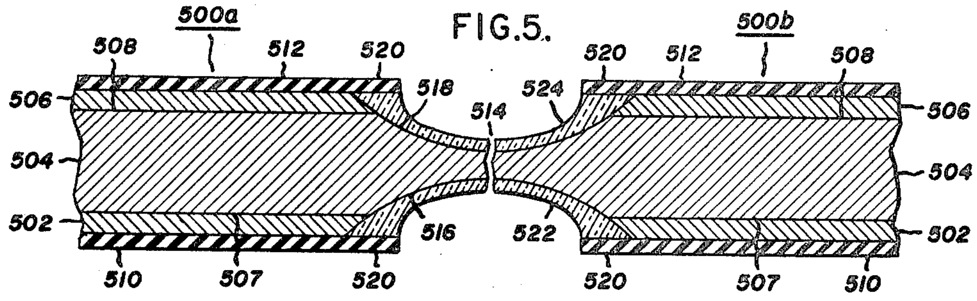
Figure 6:
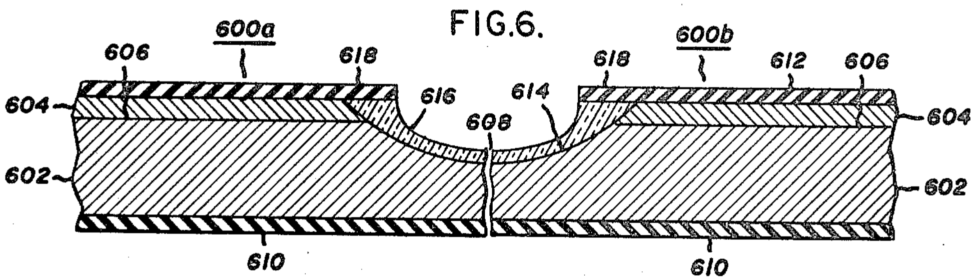
Figure 8:
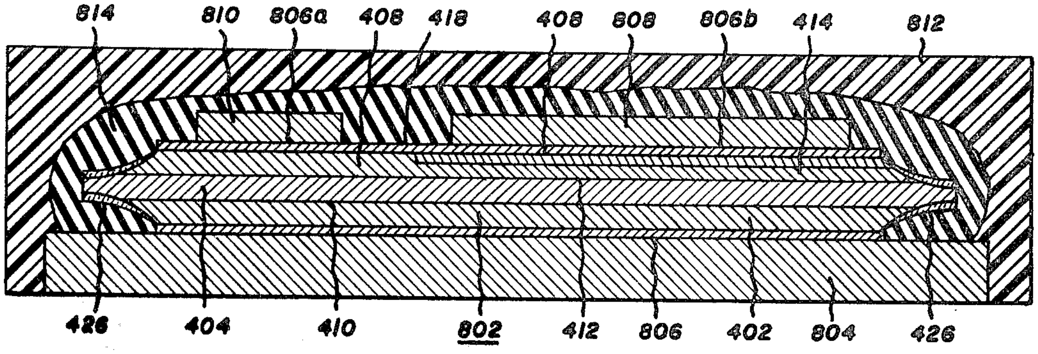
Figure 7:
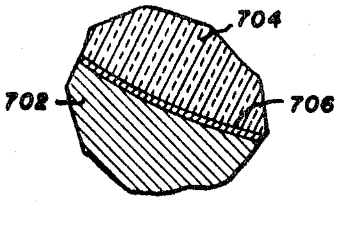

My invention may be better understood by reference to the following detailed description considered in conjunction with the drawings, in which FIG. 1 is a block diagram of a process according to my invention, FIG. 2 is a vertical elevation of an electrophoretic deposition apparatus with portions broken away, FIG. 3 is a vertical section along section line 3—3 in FIG. 2, FIGS. 4, 5, and 6 are enlarged sectional details of alternate forms of semiconductive elements formed according to my invention, FIG. 7 is an enlarged sectional detail showing the interface between the semiconductive element and the associated passivant layer, and FIG. 8 is a vertical section of a preferred semiconductor device according to my invention.

In the manufacture of semiconductor devices the semiconductive elements that form the electrically active portions of the devices may be only a few mils in diameter. Accordingly, it is conventional practice to initially slice wafers from single grown crystals relatively larger in diameter than the semiconductive elements and to introduce junction forming impurities into the wafers by conventional alloying and/or diffusion processes. In the practice of my process I employ as a starting element a semiconductive wafer having at least one junction formed therein. Preferably the wafer is of sufficient size to permit sub-division into a plurality of elements, although my process could be employed to manufacture relatively high current, large area elements in which one element is formed from a single wafer. In the preferred form the wafers employed are provided with first and second parallel opposed major surfaces and are relatively thin as compared to their length and width. For example, a typical wafer of circular configuration may range from 5 to 20 mils in thickness and from 0.5 to 3.0 inches in diameter. The wafer may be constructed of any conventional semiconductive material and will include a junction forming combination of P, N, and/or I conductivity-type regions. My process is particularly advantageous in forming silicon semiconductive elements.

The first objective in processing the wafer is selectively to expose the wafer surfaces along one or more corridors to be etched while preventing the major portion of the wafer surfaces form being attacked by etchant. This may be achieved by any one of a variety of conventional techniques. According to my preferred procedure, designated by Step A in FIG. 1, an oxide is initially formed over all exterior water surfaces. It is my observation that silica forms a highly advantageous oxide coating for wafer surfaces, since it is both electrically insulative and resistant to etchants. Also, oxides of silicon are much less susceptible to introducing objectionable contaminants into the wafers than are oxides of most other metals. Silica may be conveniently deposited on the wafer surfaces by vapor deposition, as is well understood in the art. Where the wafer is formed of silicon, the oxide may be grown on the surface—that is, the silicon for the oxide may be entirely contributed by the wafer. To function efficiently in protecting the wafer surfaces from etchant and also in acting to insulate the wafer surface from the electrophoretic deposition of passivant, the oxide coating present during these process steps should be at least 3000 A in thickness. The maximum thickness of the oxide coating is not critical and may be varied widely without adverse effect. Usually it is desirable to maintain the thickness of the oxide coating at less than 100,000 A. According to a preferred practice silicon wafers are oxidized in a steam atmosphere maintained at 1100° C for 6 to 9 hours to produce oxide coatings of from 14,000 to 20,000 A in thickness.

The oxide coating is removed from the wafer surfaces along one or more corridors to expose the portions of the semiconductive element to be etched. Where a plurality of semiconductive elements are to be sub-divided from a single wafer, a plurality of intersecting corridors forming a grid are usually desired, as indicated by Step B. The grid may be formed on a single major surface of the semiconductive element or on opposite major surfaces. The grids are, of course, aligned when formed on both major surfaces. A preferred approach for stripping the oxide from the corridors is to coat the surface areas over which it is desired to preserve the protective oxide coating and thereafter to remove the oxide with an etchant that is selective to the oxide. This may be accomplished by any one of a variety of conventional techniques. For example, a mask conforming to the grid pattern desired may be placed over the wafer surface and wax deposited over the areas not covered by the mask. The oxide within the corridors of the grid not being superimposed by wax is selectively removed with an etchant selective to the oxide such as an ammonium fluoride, hydrofluoric acid, etc. Thereafter the wax overcoat may be removed, as desired. According to an alternate technique photosensitive material is spread over the wafer surfaces and exposed to light so that a tenacious, etch resistant overcoat is formed over the area where it is desired to preserve the oxide coating. The photosensitive material is then washed free of the corridors and the selective etching of the oxide within the corridors occurs as noted above. With the oxide layer selectively removed from the grid corridors, the objective of providing the semiconductive wafer with an electrically insulative, etch resistant pattern coating required for subsequent treatment is achieved.

The semiconductive wafer with exposed grid of semiconductive material on one or both major surfaces is subjected to etching in the grid corridors to a depth below at least one junction. Any conventional etchant for semiconductive material may be employed. For silicon wafers a major proportion of nitric acid together with a minor proportion of hydrofluoric and optionally acetic acid has been found advantageous. The depression or groove formed within a corridor is not of uniform depth when viewed in cross-section. Each depression is of maximum depth in the center of the corridor and progressively diminishes in depth as the boundary of the corridor and the oxide coating is approached. The result is that the surface of the semiconductive element within the corridor forms an acute angle with the junction which it intersects. As is by now well understood in the art, properly selecting the acute angle of intersection between an edge and a junction of a semiconductive element significantly will increase the reverse bias voltage that may be withstood across the junction without breakdown and, further, allows non-destructive bulk breakdown to occur in preferance to destructive surface breakdown.

For single junction semiconductive elements it is generally preferred to form an exposed grid on one major surface only of the wafer and to etch from only one surface, although etching from both major surfaces simultaneously could be practiced, if desired. Of course, only the grooves opening from one major surface would extend to a depth below the junction. With multiple junction wafers etching may be performed from one or both major surfaces. The choice of surface from which to etch through a junction or junctions is influenced by whether a positively or negatively beveled junction is desired and the proximity of the junction or junctions to each major surface. It is realized that a groove opening from one major surface may intersect more than one junction, if desired. By controlling the groove depth with relation to the junction depth the angle of intersection between the junction and groove surfaces may be readily controlled. It is a distinct advantage of my process that etching of both major surfaces simultaneously may be practiced, if desired.

In order to retain a unitary wafer for further processing etching is terminated before the grooves intersect either opposed grooves or the opposed major surface of the wafer. The wafer is, of course, structurally weakened along planes extending axially along the grooves at their point of maximum depth. These planes are hereinafter referred to as planes of cleavage, since they are the planes along which the wafer is sub-divided into discrete semiconductive elements at a later point in the process. The wafer could, of course, be initially etched or otherwise sub-divided into unitary elements before passivant deposition, but this would fail to utilize the distinct advantage of the process of allowing many semiconductive elements to be handled as a single article.

In etching a wafer the etchant initially attacks only the semiconductive material lying in the corridors, since the protective oxide surface coating is substantially immune to attack — that is, the semiconductive material is removed at a very high rate as compared to rate of attack of the oxide. Accordingly grooves are formed in the semiconductive material while the bulk of the oxide remains in place. As the grooves are formed, however, the lateral walls of each groove sloping inwardly from the oxide protective coating will be attacked to some extent allowing the etchant to enlarge the groove beneath the oxide coating and to undercut the oxide coating. This results in an oxide lip being formed that overhangs the upper edge of the groove. I have observed that the presence of the oxide lip overlying the groove is distinctly advantageous in certain applications, but may be detrimental in others.

In following conventional passivant deposition procedures, particularly with glass passivants, no oxide lip is present overlying the grooves. It has been observed that the thickness of the passivant coating in such instance is greatest at the bottom of the grooves and becomes progressively thinner toward the intersection of the groove with the surface of the wafer. Where the junction of a wafer intersects the groove nearer the bottom of the groove than the surface of the wafer, it can be appreciated that the thickness variation of the passivant may actually contribute to improving the passivation of the junction. The thicker portion of the passivant in this case overlies the junction. On the other hand, where the junction intersects the groove nearer the wafer surface than the bottom of the groove a relatively thin layer of passivant overlies the junction and having the maximum passivant thickness at the bottom of the groove can only be characterized as a disadvantage.

I have discovered quite unexpectedly that in applying passivant to the grooves according to my process with the oxide lip in place the thickness gradation of the passivant can be reversed from that obtained by conventional processes—that is, the passivant layer is thickest immediately beneath the oxide overhang and progressively diminishes in thickness toward the plane of cleavage or groove bottom. It can be readily appreciated that this novel arrangement is particularly advantageous with semiconductive elements in which the junction intersection with the beveled edge is nearer a major surface of the element that the plane of cleavage. But regardless of the location of the junction with respect to the major surface and the groove bottom, another distinct advantage is observed. Namely, the plane of cleavage intersects the glass at its point of minimum thickness, rather than the point of maximum thickness, as is the case with conventionally formed elements. The result is that with brittle passivants, such as glass, the chances of introducing fractures or cracks into the passivant when sub-dividing a wafer into discrete elements is greatly reduced. The opportunity for contaminants to penetrate the passivant layer naturally increases with the number of fractures and cracks present, particularly adjacent the junction regions.

It is therefore apparent that Step D of my process, which calls for the removal of the oxide lip from each wafer, is optional, but may be advantageous in certain applications. In removing the oxide lip it is desirable to utilize a technique that will selectively remove the lip or overhang without injuring the major portion of the oxide layer. I have found that this can be accomplished by placing wafers having oxide lips on one or both major surfaces in an inert fluid, such as deionized water, alcohol, etc., and subjecting the wafers to ultrasonic vibrations. The wafers may be stirred or the fluid circulated concurrently with vibrating to assure that the wafers assume a variety of angular orientations during vibrating. According to an alternate approach I have found that the oxide lip on a wafer surface may also be removed by very lightly brushing the surface. In neither case does any significant damage to the remainder of the oxide coating occur.

When utilizing glass as a passivant for silicon wafers, I have discovered that the reliability with which the glass coating can be applied to all of the exposed silicon groove surfaces is improved by preliminarily treating the groove surfaces to increase their wettability by the glass. This is indicated by Step E. I have found that the contact angle between the grooves and the glass coating can be decreased and the wettability of the grooves thereby increased by providing a thin oxide layer on the groove surfaces prior to glass deposition. Since it is a feature of my process that glass is deposited in the grooves by electrophoresis, the oxide coating within the grooves must be maintained sufficiently thin that it does not present an effective electrically insulative barrier, as does the oxide coating on the unetched surfaces of the wafer. I have found quite unexpectedly that thin grown oxide coatings on the groove surfaces of up to 500 A in thickness can be formed without adversely affecting the subsequent electrophoretic deposition of the glass. Since the preliminary oxidation of the groove surfaces is an optional feature of my process, the minimum thickness of the oxide coating within the grooves is not considered critical. Any degree of oxidation will to some extent improve wettability of the grooves. I have observed distinct improvements for glass wettability with oxide coatings above about 25 A in thickness. The formation of oxide coatings having thicknesses up to about 100 A may be readily achieved by bringing the silicon groove surfaces into contact with a strong oxidizing agent, such as concentrated nitric acid or hydrogen peroxide. For example, submerging grooved silicon wafers in boiling concentrated nitric acid for periods of from 1 to 20 minutes has been found to constitute a very satisfactory wettability treatment.

The maximum time of exposure to the oxidizing agent is not critical, however, since the oxidation rate progressively decreases as the oxide layer increases in thickness. Instead of growing an oxide in the grooves the oxide may be vapor deposited. For example, silicon dioxide vapor may be deposited.

After a wafer has been groove etched to below junction depth and, optionally, after oxide lip removal and/or wettability enhancement, a passivant is selectively deposited within all grooves simultaneously by electrophoresis, as indicated by Step F. The preferred procedure for electrophoretic deposition may be best appreciated by reference to the electrophoretic deposition apparatus 100 shown in FIGS. 2 and 3. As shown, a carrier fluid 102 containing the passivant in suspension is held in tank 104. Parallel electrodes 106 and 108 are electrically grounded to the tank by mounting bars 110. The electrodes are shown as unitary plates, but may take the form of screens or other foraminous structures in order to allow greater ease of carrier migration. A fluid agitator 128 is fitted to the bottom of the tank to cause positive circulation of the carrier fluid. Also mounted in the tank is a conduit 130, which may be used to inject a fluid activator, such as ammonia, prior to and/or during deposition. Mounting arms 112 attached to opposite sides of the tank carry a rotatable shaft 114 electrically insulated from the arms and tank by bushings 116. A mounting disc 118 is attached to the shaft in electrically conductive relation, and a plurality of mounting clips 120 are attached to the periphery of the disc also in electrically conductive relation. To protect the disc and mounting clips from the deposition of passivant, an insulative exterior coating 122 is provided to overlie the exterior surfaces of these elements. A plurality of grooved wafers 124 to be treated are shown held by the clips. A direct current potential source 126 is schematically shown electrically grounded to the tank through lead 132 and electrically connected by lead 134 to the shaft, which is in turn electrically connected to the wafers through the disc and clips.

In utilization of the apparatus 100 carrier 102 having a passivant suspended therein is introduced into the tank 104. Agitator 128 circulates the carrier within the tank. Conduit 130 may be used to introduce an activator. One or more grooved wafers 124 are attached to the clips 120 so that each clip makes electrical contact with at least one electrically uninsulated groove. Alternately, a small portion of the surface insulative coating may be abraded to assure electrically conductive contact between the wafer and the mounting clip. The direct current potential source 126 is then activated to establish a potential difference between the electrodes 106 and 108 electrically attached to the tank and the wafers. With the potential difference established the shaft and disc with the wafer or wafers attached is rotated to immerse the wafer in the carrier fluid. The carrier fluid lying immediately between each major grooved wafer surface and the tank connected electrodes is placed in an electric field within which the charge carrying passivant particles are induced to migrate for selective deposition within the wafer grooves. The oxide coating lying on the major surfaces of the wafer prevents field induced deposition of glass thereon. Similarly the insulative exterior coating 122 on the clips and disc prevents the passivant from being deposited on the apparatus. The result is that the passivant is deposited only where it is needed and wanted. It is also to be noted that deposition can be simultaneously achieved within the grooves on opposite sides of each wafer. In this way identical passivant coatings may be simultaneously obtained within the grooves opening from opposite surfaces of each wafer. The passivant coatings alternately may be individually optimized if desired, merely by separately adjusting the spacing between each of the electrodes 106 and 108 and the adjacent wafer surface. Also, passivant coatings within the grooves may be varied by selectively delipping only one major surface of a wafer. For most applications the speed of disc rotation is set so that a wafer in rotating through the carrier fluid in one direction achieves the desired quantity of passivant coating. An operator or a mechanical handler can then conveniently attach and remove wafers for coating without interrupting rotation of the disc. Where only one major surface is grooved, the electrode grounded to the tank adjacent the opposite major surface may be omitted.

The preferred passivant for groove deposition is glass. As indicated by Harding et al. U.S. Pat. No. 3,280,019 the electrophoretic deposition of glass to form a surface layer on semiconductive elements is generally known to the art. Any conventional glass passivant may be deposited by electrophoresis according to my process. I prefer to use as a passivant a glass that exhibits a thermal expansion differential with respect to the semiconductive crystal of less than $5 \times 10^{-4}$. That is, if a unit length is measured along the surface of a semiconductive element with a layer of glass attached at or near the setting temperature of the glass and the semiconductive element and glass are thereafter reduced in temperature to the minimum ambient temperature to be encountered in use by a semiconductor device in which the semiconductive element is to be incorporated, the observed difference in the length of the glass layer as compared to the semiconductive element over the unit length originally measured at any temperature between and including the two extremes should be no more than $5 \times 10^{-4}$. It is appreciated that the thermal expansion differential so expressed is a dimensionless ratio of difference in length per unit length. By maintaining the thermal expansion differential below $5 \times 10^{-4}$ (preferably below $1 \times 10^{-4}$), the thermal stresses transmitted to the glass by the semiconductive element are held to a minimum, thereby reducing the possibility of cleavage, fracture, or spalling of the glass due to immediately induced stresses or due to fatigue produced by thermal cycling.

Since the passivant layer bridges at least one junction of the semiconductive element to be formed, it is desirable that the glass exhibit an insulative resistance of at least $10^{10}$ ohm-cm, so as to avoid shunting any significant leakage current around the junction to be passivated. To withstand the high field strengths likely to be developed across the junction during reverse bias, as is particularly characteristic of rectifiers, the glass layer is preferably chosen to exhibit a dielectric strength of at least 100 volts/mil and preferably at least 500 volts/mil for high voltage rectifier uses. When the semiconductive element is properly peripherally beveled and provided with a glass passivation layer the semiconductive element is capable of withstanding reverse biasing at exceptionally high potential levels without being destroyed.

Two exemplary glasses that meet the preferred thermal expansion differential, dielectric strength, and insulative resistance characteristics discussed above and which are considered particularly suitable for use with silicon semiconductive elements are set out in Table I, percentages being indicated on a weight basis.

TABLE I

| Composition | 7574 | No. 351 |
|---|---|---|
| $SiO_2$ | 12.35% | 9.4% |
| ZnO | 65.03 | 60.0 |
| $Al_2O_3$ | 0.06 | |
| $B_2O_3$ | 22.72 | 25.0 |
| $CeO_2$ | | 3.0 |
| $Bi_2O_3$ | | 0.1 |
| PbO | | 2.0 |
| $Sb_2O_3$ | | 0.5 |

Glass is commercially available under the trade name "GE Glass 351" and Glass 7574 is available under the trade name "Pyroceram 45." Other zinc-silico-borate glasses are available that meet the required physical characteristics. For example, the zinc-silico-borate glasses disclosed by Martin in U. S. Pat. No. 3,113,878, may be employed.

According to an exemplary practice the glass is divided into fine particles and passed through a 400 mesh sieve. Approximately 5 grams of the sieved glass are added to each 100 cc of a carrier liquid, such as isopropanol, ethyl acetate, methanol, deionized water, etc. The suspension is first mechanically stirred and the suspension subjected to ultrasonic agitation for 30 minutes. The suspension is allowed to stand for 30 minutes, again stirred for 5 minutes, and finally allowed to stand for 20 minutes before decanting the carrier fluid with the glass particles suspended from the settled particles. Other conventional approaches are of course available for achieving a suspension of the glass in the carrier. When the carrier fluid with the glass particles suspended is placed in the tank for use, ammonia is bubbled through the carrier to activate the solution. The ammonia is believed to assist in placing a surface charge on the glass particles for inducing migration within the field between the wafer and a spaced electrode and is believed to improve the adherence of the glass to the wafer surface. With the preferred choice of glass passivants, the preferred carrier fluids, and using ammonia as an activator the glass particles are positively charged and migrate to the wafer grooves, which are maintained at a negative potential with respect to the tank and tank grounded electrodes. With a potential difference of from 100 to 200 volts maintained between the wafer and the grounded electrodes for a period of from 0.5 to 5.0 minutes with an electrode to wafer spacing of 2 cm a glass coating ranging from 0.10 to 7.5 mils at its thickest point can be formed.

Although not specifically mentioned, it is recognized that the wafer may be washed with an inert fluid, such as deionized water, intermediate any of the foregoing process steps in the sequence of manufacture. Washing the wafer as it is being carried through the passivation procedure constitutes a desirable precaution to insure against picking up unwanted contaminants during processing. After the wafer is electrophoretically coated with passivant, it is air dried. At this juncture washing is not desirable, since this may damage the newly formed passivant coating.

Where glass is deposited as a passivant, the wafer is preferably fired after air drying, as indicated by Step G. The purpose of firing is to bring the glass particles to a temperature at which their viscosity is decreased to the point they may coalesce and form a continuous, non-particulate mass. Since glasses, unlike crystalline materials, do not possess a well defined melting point, but progressively decline in viscosity when exposed to increasing temperatures, it is recognized that a wide range of firing temperatures may be usefully employed, even considering a single glass composition. Accordingly, the glass firing temperature is not considered critical, any temperature above about 630° C being to some extent useful. The maximum firing temperature is, of course, maintained well below the melting temperature of the semiconductive crystal forming the wafer—for silicon, below about 1000° C. I have found it particularly advantageous to preheat zinc silicoborate glass coated wafers to a temperature in the range of from 500° to 615° C for 5 minutes or longer, to fire at a temperature in the range of from 650° to 750° C for 5 to 60 minutes, and to thereafter anneal the glass by maintaining the wafer at the preheating temperature range for a period of at least 30 minutes, preferably in excess of an hour. It is, of course, recognized that by going to somewhat higher temperature ranges firing times may be decreased and vice versa. Where passivants other than glass are used such as synthetic rubber or resin, the firing steps may be omitted entirely or another post-deposition curing treatment substituted, as best suits the specific passivant employed.

Figure 4:
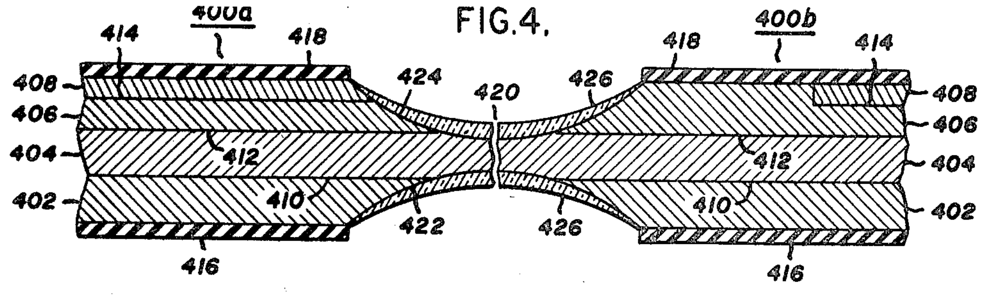

After processing the wafer through passivant deposition, they are sub-divided into discrete pellets by cleavage along the grooves, as indicated by Step H. Cleavage may be achieved by sawing, scribing, grit blasting, or by any other conventional sub-dividing techniques. FIGS. 4 through 6 inclusive show three alternate exemplary pellet forms that may be produced by the foregoing process steps. The pellets are shown as they would appear immediately subsequent to cleavage.

In FIG. 4 portions of two identical pellets **400*a* and 400*b* edge cleaved from a single wafer are illustrated. Each pellet is comprised of four regions 402, 404, 406, and 408 of a single semiconductive crystal. Regions 402 and 406 are of a first conductivity type while regions 404 and 406 are of a second conductivity type. In a preferred form regions 402 and 406 are of P-type conductivity while regions 404 and 408 are of N-type conductivity type, although this relationship could be reversed, if desired. Regions 402 and 404 form a first junction 410 at their intersection while regions 404 and 406 form a second junction 412 at their intersection. A third junction 414 is formed between regions 406 and 408. A first protective insulative layer 416 is located adjacent the layer 402, while a second insulative layer 418 overlies the opposIte major surface of each pellet. While the pellets are shown separated along cleavage plane 420, it is apparent that the pellets when integrally united in a wafer cooperate to form grooves 422 and 424 opening from the opposite major surfaces. As shown, a glass passivant layer 426 lies within each groove. It is noted that the passivant layer overlies the edge intersection of each junction. In the embodiment shown, the portion of the protective layers 416 and 418 that originally protruded over the grooves was removed prior to deposition of the passivant. The result is that the glass coating shown is thickest at the bottom of the grooves and progressively decreases in thickness toward the intersection of the groove with the protective coatings. Since the junctions 410 and 412** intersect the pellet edges nearer the bottom of the groove than the major surface from which each groove opens, the glass layers adjacent these junctions are relatively thick.

In FIG. 5 portions of two identical pellets **500*a* and 500b edged cleaved from a single wafer are illustrated. Each pellet is comprised of three regions 502, 504, and 506. Regions 502 and 504 form a juncture 507 at their intersection while regions 504 and 506 form a juncture 508 at their intersection. The junctures constitute transition regions between layers of differing resistivity, as may exist at a junction between layers of unlike conductivity type or at the interface between layers of like conductivity type containing dissimilar dopant levels. The regions 502, 504, and 506 may represent any one of the following combinations of conductivity types: P+−P−N, P−I−N, N+−N−P, N−P−N, or P−N−P. Protective insulative coatings 510 overlie opposite major faces of the pellets. While the pellets are shown separated along cleavage plane 514, it is apparent that the pellets when integrally united in a wafer cooperated to from grooves 516 and 518 opening from the opposite major surfaces. Both grooves undercut the adjacent protective coatings to form overhanging lip portions 520. The passivant layers 522 and 524 located in the grooves 516 and 518,** respectively, extend beneath the lip portions. The result is that the thickness gradation of the passivant layers is reversed from what it would be if the lip portions were omitted before the passivant layers were formed. That is, the passivant layers are thickest adjacent each major surface (immediately below the lip portions) and thinnest at the plane of cleavage, or groove trough. Since the juncture intersections with the beveled edges lie nearer the major surfaces of the semiconductive element than the groove trough or cleavage plane, it is apparent that the reversal in thickness gradation of the passivant layers is advantageous in that the thickest portion of the passivant layers lie adjacent the edge intersection of the junctures. At the same time the passivant layers are thinnest adjacent the cleavage plane, so that the thinnest portion of the passivant layers is broken sub-dividing a wafer into pellets. This is a distinct advantage, since the risk of introducing contaminant admitting cracks or fractures in the passivant during cleavage is minimized, particularly where a brittle passivant, such as glass, is employed.

In FIG. 6 portions of two identical pellets 600*a* and 600*b* edge cleaved from a single wafer are illustrated. Each pellet is comprised of a layer 602 of one conductivity type and a second region 604 of an opposite conductivity type. The regions form a junction 606 at their interface. The pellets are shown separated from a single wafer along a plane of cleavage 608. It can be seen that the insulative protective layer 610 initially covered one entire surface of the wafer and now covers one entire major surface of each pellet. Protective layer 612 provided on the opposite major surface of the pellets initially exposed a corridor along the semiconductive element through which groove 614 was etched. A passivant layer 616 is deposited within the groove and underlies a lip portion 618 of the protective layer 612. It is noted that the passivant layer 616 is generally similar to passivant layers 522 and 524 and possesses the same advantages. The pellets 600*a* and 600*b* are of particular interest, since they illustrate pellets formed by selectively etching from one major surface of a semiconductive element and selectively depositing passivant to one major surface.

FIG. 7 is a detail which is applicable to any one of the pellets of FIGS. 4, 5, and 6. The semiconductive element 702 is shown in section with the glass passivant layer 704 associated. Interposed between the semiconductive element and the passivant layer is a thin oxide coating 706. The oxide coating is very thin as compared with the thickness of the passivant layer. It improves the wettability of the semiconductive element by the glass, yet is maintained sufficiently thin that it does not interfere with the electrophoretic deposition of the glass. The oxide may be partially or wholly fused with the glass in firing so that the glass composition may be altered to reflect incorporation of the oxide at or near the wafer surface.

In order to put the semiconductive elements formed according to my invention to use, it is merely necessary to remove at least part of the protective coating by any conventional technique to allow electrical contacts to be secured to the opposite major surfaces, as is well understood in the art. The protective coatings may be removed according to the same general procedure described above in connection with process Step B.

FIG. 8 illustrates the utilization of a gate controlled rectifier element 802 formed according to my invention in a novel mounting arrangement. The semiconductive element differs from the semiconductive pellets 400*a* and 400*b* solely by the removal of the protective coating 416 and the partial removal of the protective coating 418. Accordingly, corresponding elements are assigned like reference numerals as in FIG. 4 and are not redescribed in detail. The region 402 of the semiconductive element is electrically connected to strip 804 by a conventional electrical contact layer 806, which may be a single metal layer or a composite of metal layers, as is well recognized in the art. The strip 804 preferably serves not only as an electrical connector to the region 402, but also as a heat sink for the device. A terminal contact 808 and a gate contact 810 are joined to the regions 408 and 406, respectively, by contact layers 806a and 806b, which may be identical to contact layer 806. A preferred form of the contact layers consists of a layer of chromium deposited directly to the semiconductive element surface overlaid with a layer of nickel followed by a layer of silver and a layer of soft solder. This preferred form of the contact layers is disclosed by Frank et al in copending patent application Ser. No. 782,084, filed Dec. 9, 1968, titled Novel Contact System for High Current Semiconductive Devices, the disclosure of which is here incorporated by reference.

To supplement the electrophoretically deposited passivant layers 426 in protecting the semiconductive element from chemical contamination as well as to protect the passivant layers and semiconductive element from stress and mechanical shock, particularly where the passivant layer is formed of a brittle material, such as glass as shown, a pliant, substantially fluid impervious material 814 is interposed between the glass layers overlying the edge intersection of the junction regions of the semiconductive element and the molded casement 812 that forms a housing for the device. While the pliant material forming the supplemental Passivant is displaced by the glass layers from the highest field gradients, which occur at the peripheral junction regions, the pliant material is nevertheless subjected to substantial potential gradients and accordingly should exhibit a dielectric strength of 500 volts/mil and an insulation resistance of at least $10^{10}$ ohm-cm. Where the semiconductor device is to be used as a high voltage rectifier, it is preferred that the dielectric strength of the pliant material be at least 100 volts/mil. Pliant materials meeting these electrical characteristics, exhibiting a high degree of fluid impermeability, and exhibiting a high degree of thermal stability are organopolysiloxane resins. These resins are preferably employed in the cured elastomeric form, typically designated as silicone rubber. Exemplary preferred elastomeric organopolysiloxane resins are disclosed by Berridge in U. S. Pat. No. 2,843,555 and by Modic in copending patent application Ser. No. 514,650, filed Dec. 17, 1965, the disclosure of which patent application is here incorporated by reference. As is well recognized the resins may be blended with inorganic dielectric fillers so long as the desired electrical properties are retained. It is, however, preferred in order to retain a maximum degree of fluid imperviousness that no such fillers be employed. It is preferred to employ a resilient elastomer instead of earth oxides, as has heretofore been suggested in the art, since the resilient elastomers possess a higher imperviousness to fluids, being unitary in character rather than particulate like earth oxides. Further, resilient elastomers are better able to absorb mechanical shocks and minimize the amount of shock transmitted to the semiconductive element and its glass passivation layer.

Referring to FIG. 1, formation of a completed semiconductor device may be accomplished according to the preferred procedure of my invention by taking a pellet formed by the sub-division of the pellets, as indicated by Step H, and applying contacts by any conventional technique, as indicated by Step I.

It is, of course, recognized that in many instances it may be convenient and desirable to reverse steps H and I so that the contacts are attached to the pellets while still a part of a wafer. This allows contacts to be accurately applied simultaneously to a number of pellets. With the electrical connections made to the pellet the pliant encapsulant is positioned around the exposed portions of the pellet, particularly adjacent the passivant layers. This is indicated by Step J. Depending on the particular pliant encapsulant chosen, the encapsulant may be cured or otherwise treated to set it in position. For example, using an elastomeric polysiloxane resin or rubber, the encapsulant may be allowed to set or vulcanize merely by standing at room temperature or at a slightly elevated temperature. Instead of silicone rubber other conventional encapsulants, such as bentonite, silicone grease, etc., may be substituted, but to less advantage. With the encapsulant in place the casing or housing of the device is molded, as indicated by Step K. This is preferably accomplished by injection molding, although any other conventional molding procedure may be employed.

To illustrate the practice of my invention with reference to a specific application, 20 silicon wafers 1.3 inches in diameter and 8 mils thick were chosen to form a plurality of semiconductive elements similar to those shown in FIG. 4. The wafers were formed with four superimposed layers corresponding to layers 402, 404, 406, and 408 of FIG. 4. The layers corresponding to layers 402 and 406 were of P-type conductivity while the layers corresponding to layers 404 and 408 were of N-type conductivity. The junctions between layers corresponding to junctions 414, 412, and 410 were located 0.78, 1.53, and 6.31 mils, respectively, below the surface of the wafers to receive gate contacts.

To surface oxidize the wafers they were heated to 1100° C for 6 hours in a steam atmosphere and then slowly cooled at a rate of 1° C/minute to 600° C and then exposed to ambient air for final cooling. The wafers were cleaned with a fluorocarbon solvent and dried at 200° C.

To selectively remove the oxide from the surfaces along a grid of intersecting corridors aligned photoresist masks were applied to opposite major surfaces of the wafers. The mask left exposed 10 mil wide oxide corridors defining a plurality of square masked areas of 105 mils on an edge. The exposed oxide lying in the corridors was selectively etched from the major surfaces with an ammonium bi-fluoride buffered solution of hydrofluoric acid. The photoresist mask was removed after etching by boiling the wafers successively for 2 minute periods in sulfuric acid, nitric acid, and then sulfuric acid, followed by rinsing in deionized water.

With semiconductive surfaces of the wafer selectively exposed along the corridor grid the wafers were immersed in an etching solution of acid comprised of 5 parts nitric acid per part of hydrofluoric acid. The acid contained about 1 percent by weight urea as a stabilizing agent. The wafers were allowed to remain in contact With the acid solution for 2.8 minutes. Aligned grooves were etched in the opposite major surfaces of the wafers to form a grid. The grooves were noted to range from 2.5 to 2.7 mils in depth and were 14 mils wide adjacent the surface. Thus, the oxide layer on the surfaces of the wafer was undercut adjacent each groove by a depth of 2 mils. The overhang or lip portion was removed by gently stroking with a fiberglass brush.

The etched wafers were cleaned in a solution of 17 percent hydrofluoric acid, 31 percent acetic acid, and 52 percent nitric acid, volume basis, and rinsed in distilled water. To form a thin oxide wetting film in the grooves the wafers were boiled in nitric acid for 10 minutes. This produced an oxide film of about 100 A in thickness in the grooves. The wafers were rinsed in deionized water and centrifuged dry.

GE 351 glass sieved for particle sizes of less than 10 microns was suspended in isopropanol to yield a glass concentration of 5 mg/ml. The solution was placed in an apparatus similar to that shown in FIGS. 2 and 3 and saturated with anhydrous ammonia. The wafers were then attached to clips as shown in FIGS. 2 and 3. The tank grounded electrodes were spaced 2 centimeters from the center plane of the wafers and parallel thereto. Each tank grounded electrode was formed of a rectangular stainless steel sheet 3 by 11 inches. A potential of 170 volts was established between the electrodes and the wafers. Each wafer was immersed in the glass suspension for 2 minutes.

After removing the wafers from the suspension the isopropanol was allowed to evaporate from the wafers leaving glass in the grooves of the wafers. The dried wafers were edge stacked in spaced relation in a quartz wafer holder and placed in a 575° C tube furnace for 15 minutes of preheating. The wafers were transferred to another portion of the tube furnace maintained at 710° C for a 45 minute firing period and then returned to the 575° C portion of the furnace for a 2 hour annealing period. After removal from the furnace the pellets were allowed to cool to room temperature. The glass was thickest in the trough of the grooves (1.5 to 1.72 mils) and thinned toward the major surfaces of the wafers.

The wafers where masked over the glass coated grooves and grit blasted with alumina particles to selectively remove the oxide layer from the major surfaces. The wafers were then masked to expose areas conforming to the areas covered by contact layers 806, **806*a*, and 806*b*** in FIG. 8. Chromium, nickel, and silver were successively vapor deposited. The wafers were then sub-divided into individual pellets by scribing the glass in the center of the grooves and breaking along the scribed lines.

The pellets were assembled into a device arrangement as shown in FIG. 8 to meet TO-66 mounting specifications. A pliant room temperature vulcanizing silicone rubber was utilized having a dielectric strength of 800 volts/mil and an insulation resistance of $1 \times 10^{14}$ ohm-cm. The casement was formed by injection molding a rigid silicone resin. The resultant devices were capable of carrying up to 8 amperes steady state RMS current with half-cycle (60 hz) current surges of up to 100 amperes per microsecond (switching from 200 volts). Ninety percent of the devices were capable of blocking forward voltages above 200 volts and 50 percent successfully blocked forward voltages of 400 volts.

The devices exhibited a $dv/dt$ capability above 40 volts per microsecond.

In one variation of the above procedure the oxide overhang was left on the wafers until after electrophoretic deposition was completed. In this instance a reverse gradation of the glass thickness was noted. The glass exhibited a thickness of approximately 2 mils at its interface with the oxide overhang and thinned progressively toward the center of the grooves.

While I have described my invention with reference to certain preferred embodiments, it is appreciated that numerous variations will readily occur to those skilled in the art. For example, while I have shown certain transistor, diode, and gate controlled rectifiers as representative of preferred constructions according to my invention, it is appreciated that my teachings may be also applied to other discrete devices, such as triacs, and to integrated circuit arrangements. While I have disclosed only a gate controlled rectifier element assembled to its final form with contacts applied and encapsulant and molded housing surrounding the element, it is considered that it would be obvious to apply the pellets 500 or 600 to a similar arrangement in view of my teachings. In order to achieve the advantages of my invention it is, of course, not necessary to mount the semiconductive elements in a preferred casing as shown in FIG. 8, the semiconductive elements being also useable with conventional housing and mounting arrangements. Still other variations may be made within the purview of my invention. Accordingly, it is intended that the scope of my invention be determined by reference to the following claims.

What I claim and desire to secure by Letters Patent of the United States is:

1. A process for passivating junction containing semiconductive elements comprising selectively forming an electrically insulative etch resistant coating on a semiconductive wafer having parallel opposed major surfaces to form exposed intersecting corridors aligned on each major surface, selectively etching the wafer along the exposed corridors to form aligned grooves extending into the semiconductive wafer from each major surface, the grooves opening from at least one major surface being etched to a depth below at least one junction, selectively and simultaneously electrophoretically depositing glass into the grooves on opposite surfaces of the wafer, firing the glass deposit, stripping at least a portion of the insulative coating from each major surface of a semiconductive element, attaching electrical contacts, cleaving the wafer along the grooves to form a plurality of semiconductive elements, encapsulating the semiconductive element with a pliant supplementary passivant, and molding a casement about the semiconductive element, electrical contacts, and supplementary passivant.

* * * * *